(12) United States Patent
Yan et al.

(10) Patent No.: US 7,584,440 B2
(45) Date of Patent: Sep. 1, 2009

(54) METHOD AND SYSTEM FOR TUNING A CIRCUIT

(75) Inventors: Rongchang Yan, New Kensington, PA (US); Prakash Gopalakrishnan, Allison Park, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 54 days.

(21) Appl. No.: 11/580,735

(22) Filed: Oct. 12, 2006

(65) Prior Publication Data

US 2008/0104548 A1    May 1, 2008

(51) Int. Cl.
*G06F 17/50* (2006.01)
(52) U.S. Cl. .............................. 716/5; 716/2
(58) Field of Classification Search ............ 716/4, 716/9, 10, 13, 14
See application file for complete search history.

(56) References Cited

U.S. PATENT DOCUMENTS

| | | | | |
|---|---|---|---|---|
| 5,901,063 A * | 5/1999 | Chang et al. | | 716/4 |
| 5,984,510 A * | 11/1999 | Guruswamy et al. | | 716/2 |
| 6,209,123 B1 * | 3/2001 | Maziasz et al. | | 716/14 |
| 6,418,551 B1 * | 7/2002 | McKay et al. | | 716/5 |
| 6,487,705 B1 * | 11/2002 | Roethig et al. | | 716/6 |
| 6,618,834 B2 * | 9/2003 | Takeyama et al. | | 716/2 |
| 6,678,871 B2 * | 1/2004 | Takeyama et al. | | 716/6 |
| 6,826,517 B2 * | 11/2004 | Okada | | 703/2 |
| 7,032,194 B1 * | 4/2006 | Hsueh et al. | | 716/4 |
| 7,039,881 B2 * | 5/2006 | Regan | | 716/3 |
| 7,139,987 B2 | 11/2006 | Zhang et al. | | |
| 7,231,619 B1 * | 6/2007 | Agmon | | 716/5 |
| 7,302,651 B2 * | 11/2007 | Allen et al. | | 716/3 |
| 7,340,697 B2 * | 3/2008 | Boshart et al. | | 716/3 |
| 7,363,601 B2 * | 4/2008 | Heng et al. | | 716/3 |
| 2002/0023252 A1 * | 2/2002 | Lee et al. | | 716/6 |
| 2002/0083398 A1 * | 6/2002 | Takeyama et al. | | 716/1 |

(Continued)

FOREIGN PATENT DOCUMENTS

JP      2001052041 A  *  2/2001

OTHER PUBLICATIONS

U.S. Appl. No. 11/006,323, filed Dec. 6, 2004, by Dengi et al.

(Continued)

*Primary Examiner*—Phallaka Kik
(74) *Attorney, Agent, or Firm*—Wheelock Chan LLP; Thomas Chan

(57) ABSTRACT

The present invention relates to a method and system for tuning a circuit. In one embodiment, the method includes receiving a description of the circuit, and selecting a design point of the circuit for evaluation using a sizing tool, where the design point comprises a design of the circuit that meets a set of predefined design specifications, and the circuit comprises a group of circuit devices. The method further includes receiving a set of tuning information for the group of circuit devices tuning the group of circuit devices using the set of tuning information to create a group of tuned circuit devices, creating an updated layout of the group of tuned circuit devices using a layout tool, creating estimated parasitic information of the group of tuned circuit devices using the updated layout, and verifying the design point meets design goals of the circuit using the estimated parasitic information of the updated layout.

27 Claims, 12 Drawing Sheets

U.S. PATENT DOCUMENTS

2003/0009727 A1* 1/2003 Takeyama et al. ............... 716/1
2003/0009733 A1* 1/2003 Hathaway et al. ............... 716/6
2003/0069722 A1* 4/2003 Beattie et al. .................. 703/14
2003/0084418 A1* 5/2003 Regan ......................... 716/14
2008/0022232 A1* 1/2008 McConaghy et al. ........... 716/1

OTHER PUBLICATIONS

U.S. Appl. No. 11/361,928, filed Feb. 23, 2006, by Liu et al.

* cited by examiner

Tuning Variables

| Design Variable | Sample Values, Format: [Min:Increment:Max] | |
|---|---|---|
| M1_length | [20u:2u:30u] | ⎫ Device tuning variables |
| Bias_current | [500u:50u:2u] | |
| M2_length | [4u:2u:10u] | |
| M3_length | [10u:2u:20u] | ⎭ |
| RFTUNE_DEVICE_X_C0 | [0u:10u:90u] | ⎫ Device location tuning variables |
| RFTUNE_DEVICE_Y_C0 | [-110u:10u:110u] | ⎭ |
| RFTUNE_ORIENTATION_i20 | [0:1:7] | ⎫ Device orientation tuning variables |
| RFTUNE_ORIENTATION_C0 | [0:1:7] | ⎭ |
| RFTUNE_NET_E_M1_D | [0.7:0.1:1] | ⎫ Length of net tuning variables |
| RFTUNE_NET_E_i2_in | [0.7:0.1:1] | ⎭ |
| RFTUNE_LAYOUT | [70:10:100] | ⎬ Layout area tuning variable |

FIG. 8

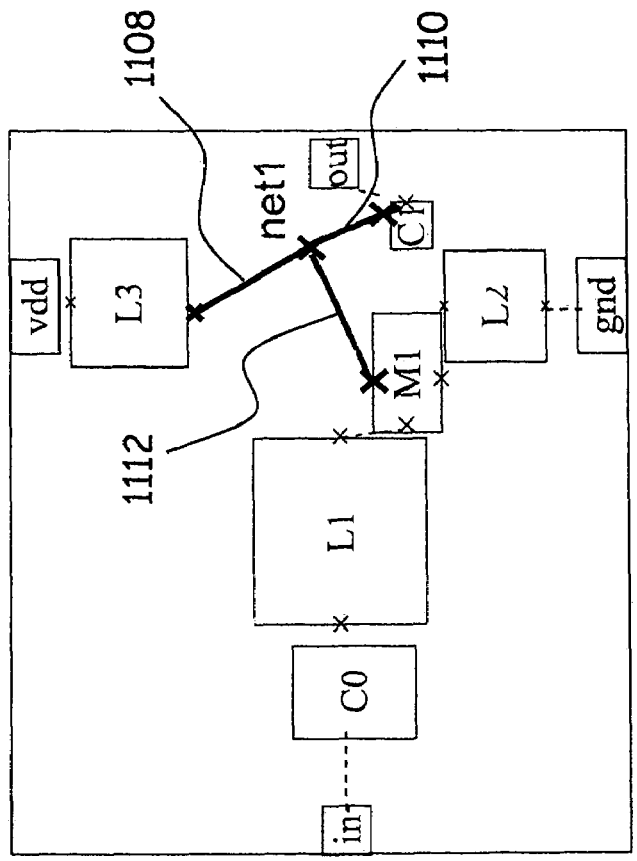
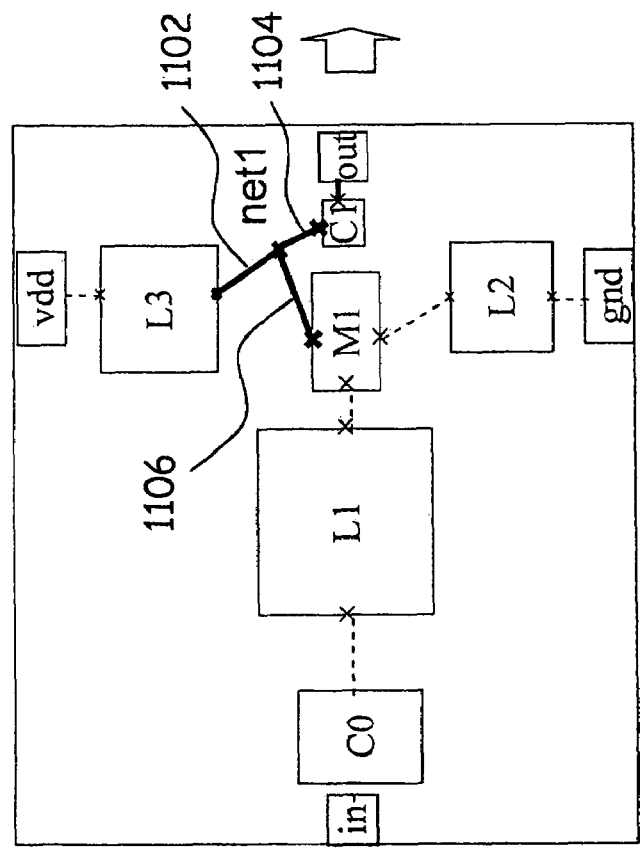
Tune Length of net1 by Scaling
FIG. 11

METHOD AND SYSTEM FOR TUNING A CIRCUIT

FIELD OF THE INVENTION

The present invention relates to the field of electronic design automation tools. In particular, the present invention relates to a method and system for tuning a circuit.

BACKGROUND OF THE INVENTION

In a conventional integrated circuit design approach for analog and radio frequency (RF) applications, the front-end design is separated from the back-end design. A front-end circuit designer would hand off the design to a back-end circuit designer to create the layout. As a result, the parasitic effects from the layout are not taken into account in the front-end design process. This conventional design approach is particularly challenging for analog and RF circuit designs. For example, an RF design is sensitive to the accuracy of interconnect parasitic information. The capacitance, inductance, and resistance of wires between devices may have a significant impact on the electrical performance of the RF circuit. Further, even when parasitic effects are taken into account in the front-end design by using a prototype layout created during the early design process, as the device sizes are updated during the sizing process, the layout also needs to be updated to reflect the new set of device sizes. This in turn affects the layout parasitic information, which may lead to multiple iterations between the processes of circuit sizing and layout and may prolong the product development schedule. Therefore, there is a need for a new set of design tools that can effectively communicate parasitic information between the circuit sizing process and the circuit layout process.

In addition, after the initial circuit design and layout are completed, there are situations where the design and layout may need to be tweaked. This may be due to an Engineering Change Order (ECO), where the top-level design specifications and constraints may have changed after the design is completed. For instance, the new requirement may demand higher gain for the circuit. As a result, the sizes of some transistors in the circuit may need to be adjusted to meet the new specifications. This impacts not only the design, but also the layout, since a change in design affects the device sizes in the layout, which in turn affects the layout parasitic information and therefore the circuit performances. Under this scenario, it is time-consuming to re-design the entire circuit and create a new layout. To address this issue, one approach is to tweak some of the device sizes in the existing design and/or to tweak some aspects of the layout such as the device locations. This approach is referred to as circuit and layout tuning. Most commonly used techniques for circuit and layout tuning today are manual, whereby certain aspects of the circuit are adjusted manually. There is no direct communication between the sizing tool and the layout tool regarding the parasitic effects as a result of tuning the circuit. For RF and analog circuits, this approach is quite cumbersome, because the analog and RF circuits are more sensitive to parasitic effects.

Therefore, there is a need for an integrated and automated circuit sizing and layout tool with circuit tuning capability for designing analog and RF circuits.

SUMMARY

The present invention relates to a method and system for tuning a circuit. In one embodiment, the method includes receiving a description of the circuit, and selecting a design point of the circuit for evaluation using a sizing tool, where the design point comprises a design of the circuit that meets a set of predefined design specifications, and the circuit comprises a group of circuit devices. The method further includes receiving a set of tuning information for the group of circuit devices, tuning the group of circuit devices using the set of tuning information to create a group of tuned circuit devices, creating an updated layout of the group of tuned circuit devices using a layout tool, creating estimated parasitic information of the group of tuned circuit devices using the updated layout, and verifying the design point meets design goals of the circuit using the estimated parasitic information of the updated layout.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

FIG. 8 illustrates an example set of design variables and their corresponding sample values according to an embodiment of the present invention.

FIG. 11 illustrates a method for tuning lengths of nets according to an embodiment of the present invention.

DESCRIPTION OF EMBODIMENTS

Methods and systems are provided for tuning a circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed instruction, logic block, process, etc., is here conceived to be a self-consistent sequence of one or more instructions leading to a desired result. The instructions are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each instruction may be performed by hardware, software, firmware, or combinations thereof.

Figure 1:
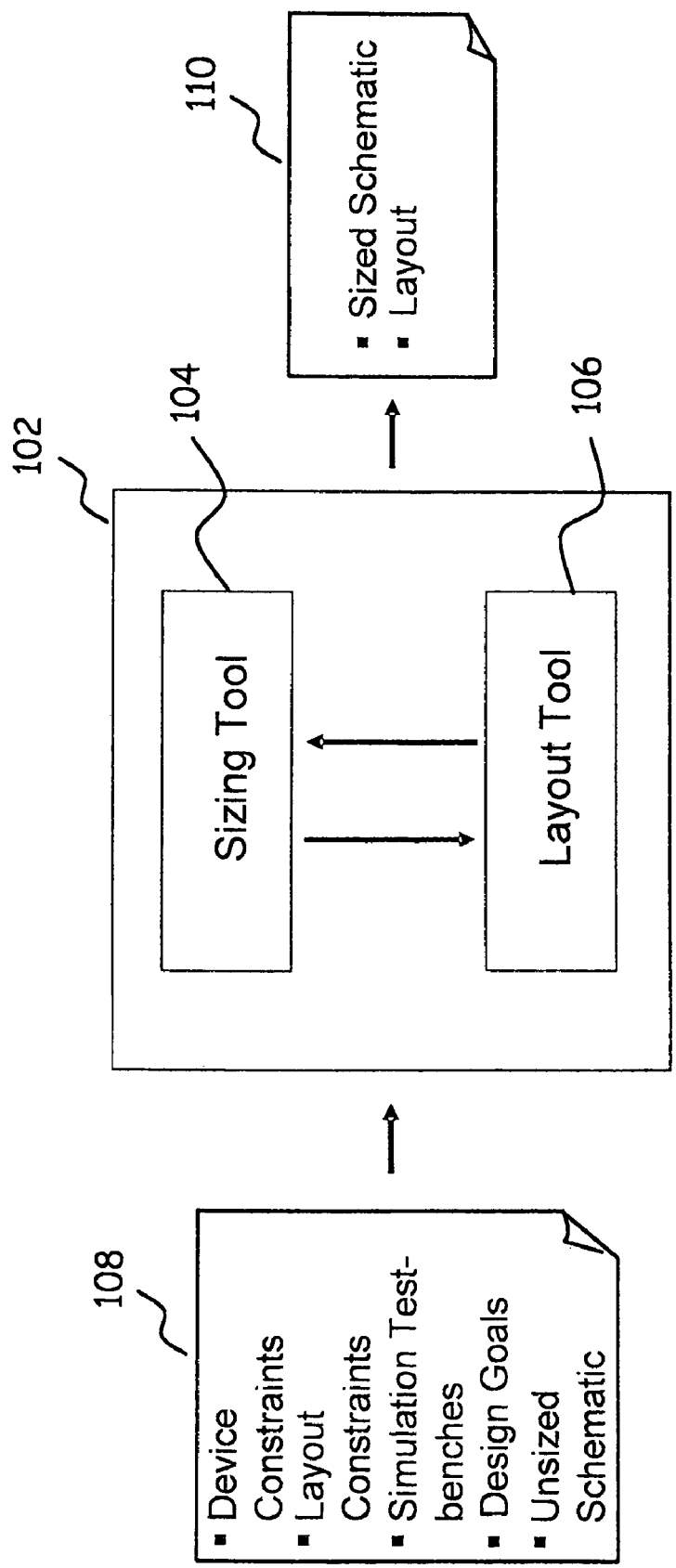
FIG. 1 illustrates a block diagram of a conventional sizing and layout tool without circuit tuning capabilities.

FIG. 1 illustrates a block diagram of a conventional sizing and layout tool without circuit tuning capabilities. As shown in FIG. 1, the conventional sizing and layout tool 102 includes a sizing tool 104 and a layout tool 106. The sizing tool 104 and layout tool 106 may pass circuit-related information to each other as indicated by the arrows between the two blocks. An input block 108 contains inputs to the sizing and layout tool 102. The inputs include an unsized schematic, device constraints, layout constraints, simulation test-benches, and design goals. An output block 110 contains outputs of the sizing and layout tool 102. The outputs include a sized schematic and a layout of the circuit being optimized.

One method for implementing the conventional sizing and layout tool of FIG. 1 is described in U.S. patent application Ser. No. 11/006,323, "Method for Simultaneous Synthesis, Placement and Routing of Analog and RF IC Designs," assigned to Cadence Design Systems, Inc., which is incorporated herein in its entirety by reference. Another method for implementing the conventional sizing and layout tool of FIG. 1 is described in U.S. patent application Ser. No. 10/618,237, "Analog Integrated Circuit Layout Design," assigned to Cadence Design Systems, Inc., which is incorporated herein in its entirety by reference.

Figure 2:
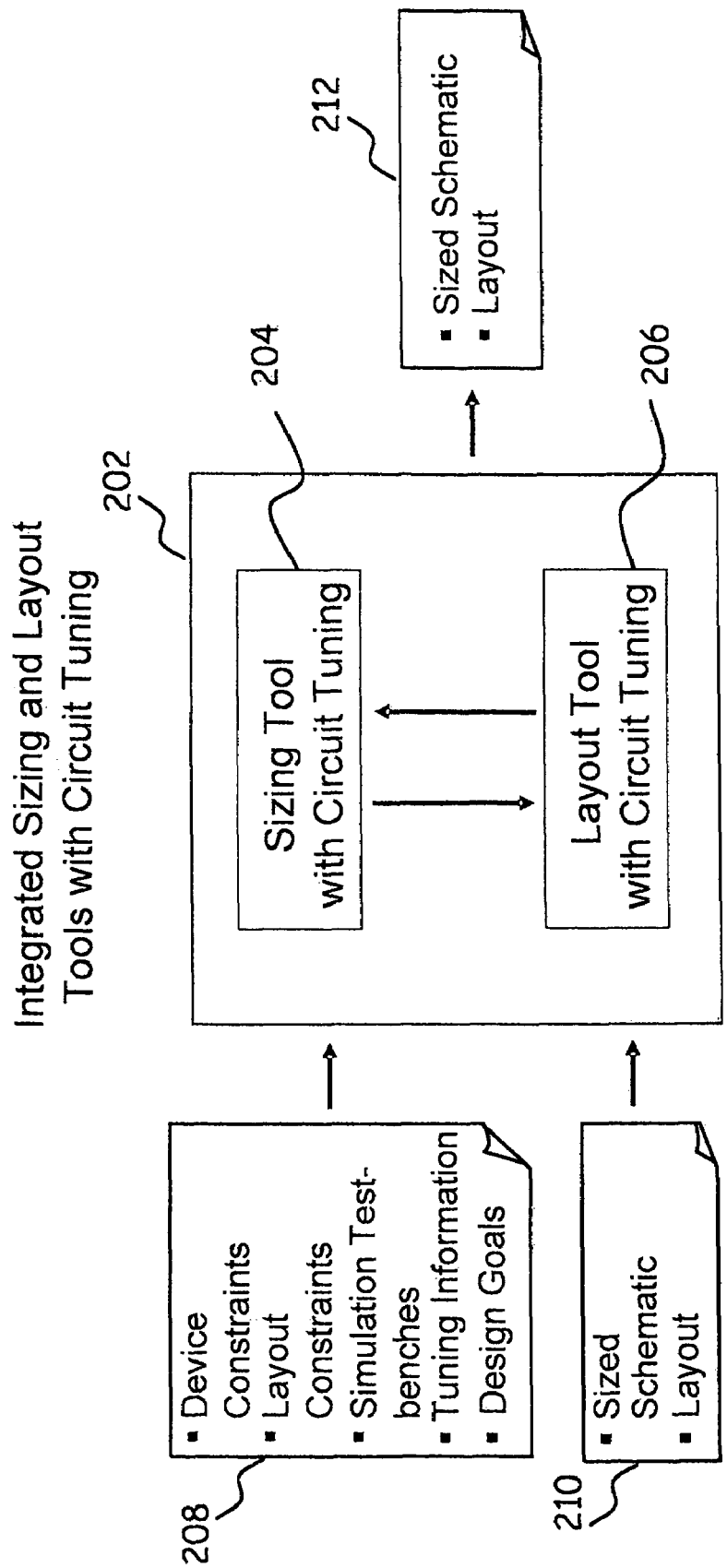
FIG. 2 illustrates a block diagram of an integrated sizing and layout tool with circuit tuning according to an embodiment of the present invention.

FIG. 2 illustrates a block diagram of an integrated sizing and layout tool with circuit tuning according to an embodiment of the present invention. This example discloses a method for providing an integrated and automated circuit and layout tool with circuit tuning capabilities for designing analog and RF circuits. Given a sized schematic and a corresponding layout, the method describes ways to identify and tune device locations, device orientations, lengths of nets, and layout area. As shown in FIG. 2, the integrated sizing and layout tool 202 includes a sizing tool 204 with circuit tuning capabilities and a layout tool 206 with circuit tuning capabilities. The sizing tool 204 and layout tool 206 may pass circuit-related information to each other as indicated by the arrows between the two blocks. The blocks 208 and 210 contain inputs to the integrated sizing and layout tool 202, and the block 212 contains outputs of the integrated sizing and layout tool 202.

Specifically, the input block 208 includes device constraints, layout constraints, simulation test-benches, design goals, and tuning information. Device constraints are constraint values for the device parameters, such as the widths and lengths of devices. These constraints specify the allowable range of values for the device parameters. Layout constraints are constraints for placing devices in a layout. For example, positioning devices symmetrically is a layout constraint. Simulation test-benches specify simulator tools and types of simulations that may run on the circuit in order to evaluate the performance of a circuit, for a given set of device parameters. The design goals specify target values for the evaluated performances of a circuit. Tuning information may include device sizes, device locations, device orientations, scales of lengths of nets, and scales of layout area.

In addition, the input block 210 includes a sized schematic and a layout for the integrated sizing and layout tool to process. Note that both the sized schematic and the layout contained in the input block 210 may be the output of another integrated sizing and layout tool, or they may also have been generated independent of each other, i.e., the sized schematic from a sizing tool and the layout from a layout tool. These may also have been manually generated, without the use of either a sizing tool or a layout tool. The sized schematic and the layout are used as starting points to tune the layout. For instance, during sizing optimization, the sizes of the devices from the sized schematic are used as a starting point to vary the values of device sizes around the starting values. Similarly, as to be described below, the device locations, device orientations, scales of lengths of nets, and scales of layout area are used to tune the layout. The outputs of the sizing and layout optimization with circuit tuning capabilities are represented by box 212, which includes a sized and tuned schematic and its corresponding layout. The tuned schematic contains optimal values for the sizes of the devices resulting from the integrated sizing and tuning optimization. The layout contains the optimal device locations, device orientations, lengths of nets, and layout area that are generated by the layout tool using the optimal tuning information values.

In one embodiment, the integrated sizing and layout program with circuit tuning capabilities may be implemented using a computer system. The computer system may include one or more central processing units (CPUs), at least a user interface for displaying computation results and waveforms, a memory device, a system bus, and one or more bus interfaces for connecting the CPU, user interface, memory device, and system bus together. The computer system also includes at least one network interface for communicating with other devices on a computer network. In alternative embodiments, much of the functionality of the integrated sizing and layout program may be implemented in one or more application-specific integrated circuits (ASICs) or field-programmable gate arrays (FPGAs), thereby either eliminating the need for a CPU, or reducing the role of the CPU.

The memory device may include high-speed random-access memory and may also include non-volatile memory, such as one or more magnetic disk storage devices. The memory device may also include mass storage that is remotely located from the CPU(s). The memory device preferably stores:

an operating system that includes procedures for handling various basic system services and for performing hardware-dependent tasks;
    databases for storing information of the circuit;
    application programs for performing other user-defined applications and tasks; and
    an integrated sizing and layout program with circuit tuning capabilities for tuning the circuit.

The database, the application programs, and the integrated sizing and layout program may include executable procedures, sub-modules, tables, and other data structures. In other embodiments, additional or different modules and data structures may be used, and some of the modules and/or data structures listed above may not be used.

Figure 3:
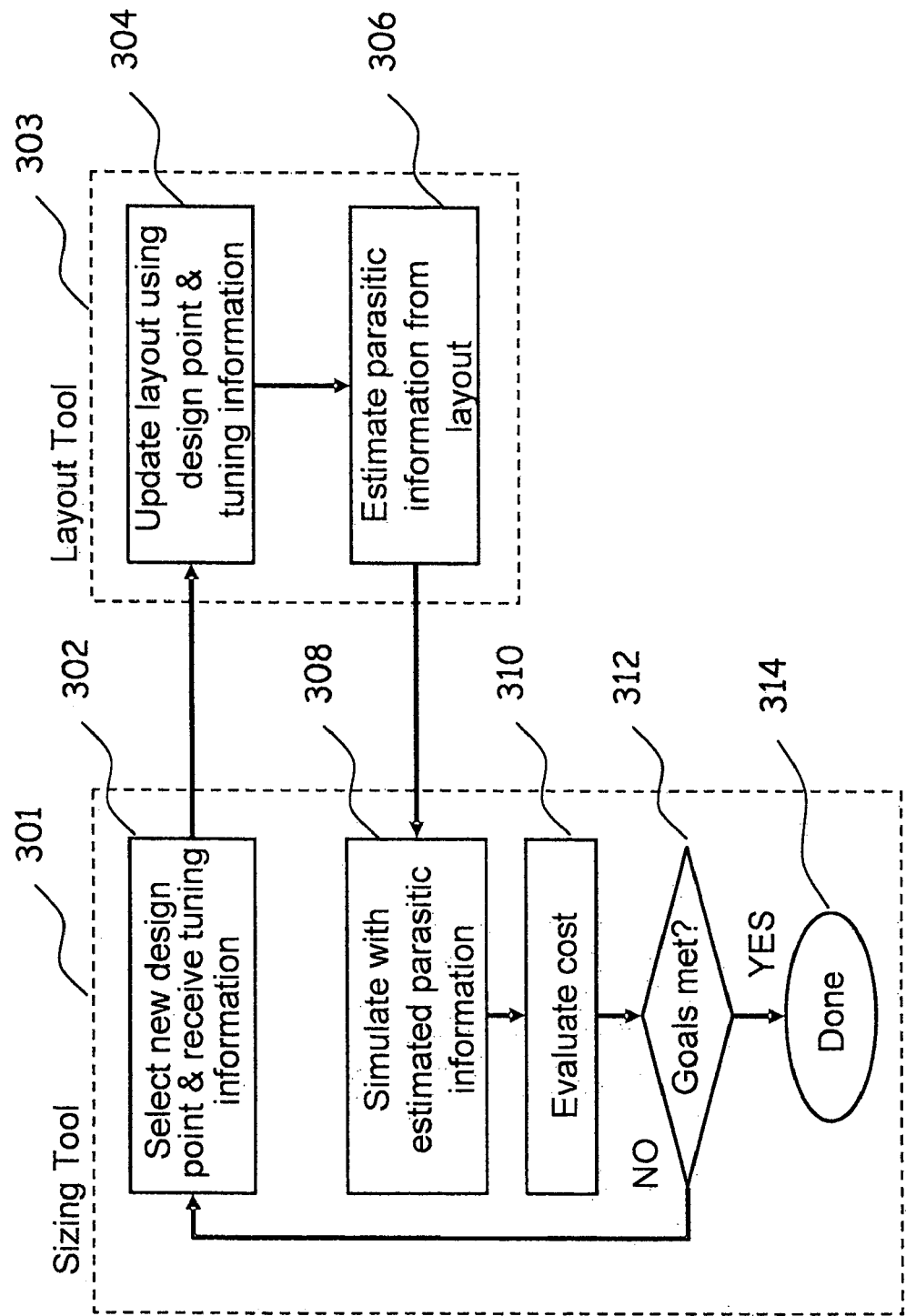
FIG. 3 illustrates a method for tuning an analog or RF circuit using an integrated sizing and layout tool according to an embodiment of the present invention.

FIG. 3 illustrates a method for tuning an analog or RF circuit using an integrated sizing and layout tool according to an embodiment of the present invention. In general, the method for tuning an analog or RF circuit using an integrated sizing and layout tool includes the following instructions. The first set of instructions identifies tuning ranges for device locations, device orientations, net scaling, and layout area scaling from a given layout. The second set of instructions tunes variables in the sizing tool for each of the following parameters: device sizes, device locations, device orientations, net scaling and layout area scaling. The sizing tool communicates device sizes, device locations, device orientations, net scaling, and layout area scaling information to the layout tool. The third set of instructions updates layout using tuning information. This includes updating the existing layout, using new device locations, device orientations, net scaling, and layout area scaling tuning information. Each of these instructions is further described in the following paragraphs in association with FIG. 3.

In one implementation, the instructions performed in the sizing tool are shown in the dotted box 301. The instructions performed in the layout tool are shown in the dotted box 303. The sizing tool is enhanced to include circuit tuning information. In general, the sizing tool may receive as user inputs device constraints such as transistor width and length ranges, and performance goals such as the maximum gain of the transistor. During the optimization process, the sizing tool iterates through a set of design points with values within the maximum and minimum tuning ranges of the device variables. As the sizing tool explores various design points, it tunes the parameters within the tuning ranges for the device location, device orientation, net scaling, and layout scaling tuning variables. These tuned values are sent from the sizing tool to the layout tool and are used to automatically update the layout. The layout tool sends back information such as lengths of nets and layout area to the sizing tool. The sizing tool uses the parasitic information to estimate parasitic capacitances and resistances during circuit simulation. The results from these simulations are used to evaluate the performance goals for the design in the sizing tool. The overall optimization process thus evaluates various tuning values for device sizes. device locations, device orientation, net scaling, and layout area scaling until a design that meets the desired performance specifications is found. The result of the optimization process is a tuned circuit and a tuned layout that meet the performance specifications of the design.

Specifically, in block 302, the sizing tool selects a new design point and receives tuning information. The tuning information includes values for each of the device location, device orientation, net scaling, and layout area scaling variables. The sizing tool then sends over the design point and tuning information to the layout tool. In block 304, the layout tool updates the layout using the design point and tuning information. After the layout is updated, the lengths of nets and layout area are measured from the layout, which are used to estimate parasitic information from the updated layout in block 306. In block 306, the layout tool sends the estimated parasitic information to the sizing tool. In block 308, the sizing tool uses the estimated parasitic information received from the layout tool to simulate the circuit. In block 310, the results of the simulation and the current values of the tuning information are used to evaluate the cost of the design point. In block 312, a determination is made as to whether all the design goals are met. If all the design goals are met (312_Yes), the method ends in block 314. Alternatively (312_No), the method continues with the optimization process in block 302. One method for evaluating the cost of the design point and determining whether design goals of the circuit are met is described in U.S. patent application Ser No. 11/361,928, "Method and System for Improving Yield of an Integrated Circuit" assigned to Cadence Design Systems, Inc., which is incorporated herein in its entirety by reference.

In the following sections, various circuit tuning techniques are described that may be used to enhance an integrated sizing and layout tool in order to optimally tune device sizes. device locations, device orientations, lengths of nets, and layout areas. Those skilled in the art may recognize that the techniques described in the present disclosure may be used along with other integrated sizing and layout tools.

Figure 4:
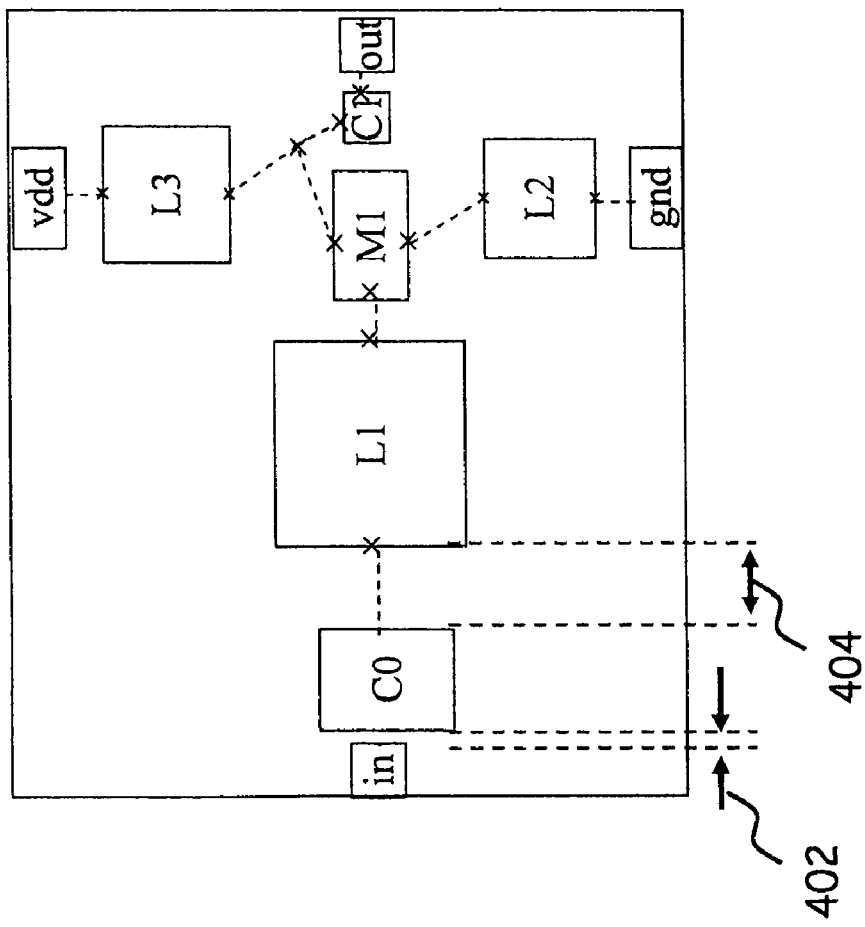
FIG. 4 illustrates a method for identifying ranges of device locations according to an embodiment of the present invention.

FIG. 4 illustrates a method for identifying ranges of device locations according to an embodiment of the present invention. Device location tuning allows the (x,y) locations of devices to be tuned by moving them in the layout. The tuning ranges for device locations can be identified by analyzing the allowable distances around the device in a given layout. For example, the maximum distance the device can be moved without overlapping other devices is the device location tuning range for device C0. In this example, C0 can be moved a distance, 402, towards the left before it overlaps with device "in". Similarly, it can be moved a maximum distance 404 to the right before it overlaps with device L1. This provides the range of distances in the "x" direction (horizontal direction) for tuning the device location of C0. Similarly, tuning ranges along the "y" direction (vertical direction) may be determined. Note that there may be further layout constraints that restrict the ranges for the devices. For example, the design may require a device not to be moved farther than a certain distance from its original location. The ranges may also be restricted by layout constraints between two or more devices. For instance, a device may be required to be placed symmetrically with respect to another device. Devices in certain groups may not be allowed to move away from each other, farther than a certain distance.

Figure 5:
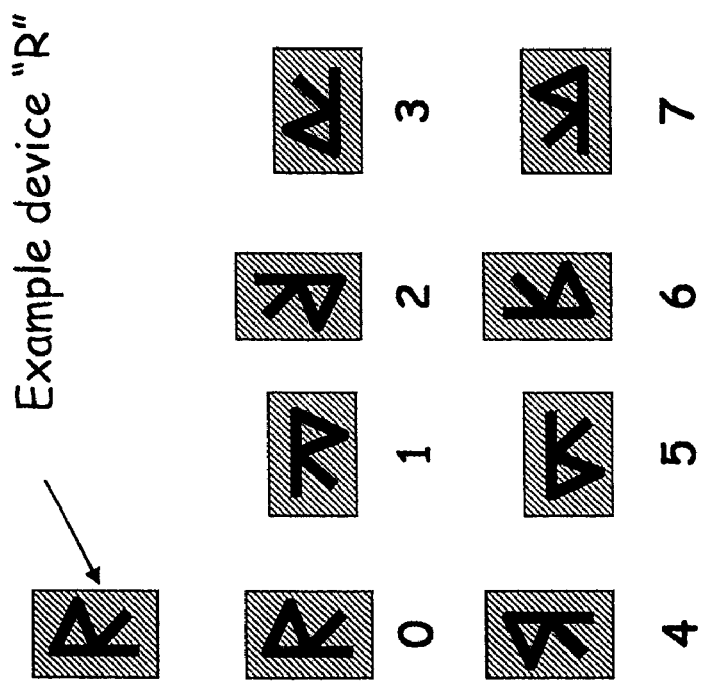
FIG. 5 illustrates representations of orientations of a device according to an embodiment of the present invention.

FIG. 5 illustrates representations of orientations of a device according to an embodiment of the present invention. As shown in FIG. 5, the orientations of devices may be tuned by flipping and rotating the devices in various directions. In this example, the device (represented by letter R) may have eight different orientations. Each orientation is associated with an integer number between 0 and 7, which provides a reference to a particular orientation. Note that the orientations of certain devices may also be restricted by layout constraints, which limit the number of orientations allowed for the device. In addition, certain devices may also be matched with other devices, thereby requiring the same orientations for the devices.

Figure 6:
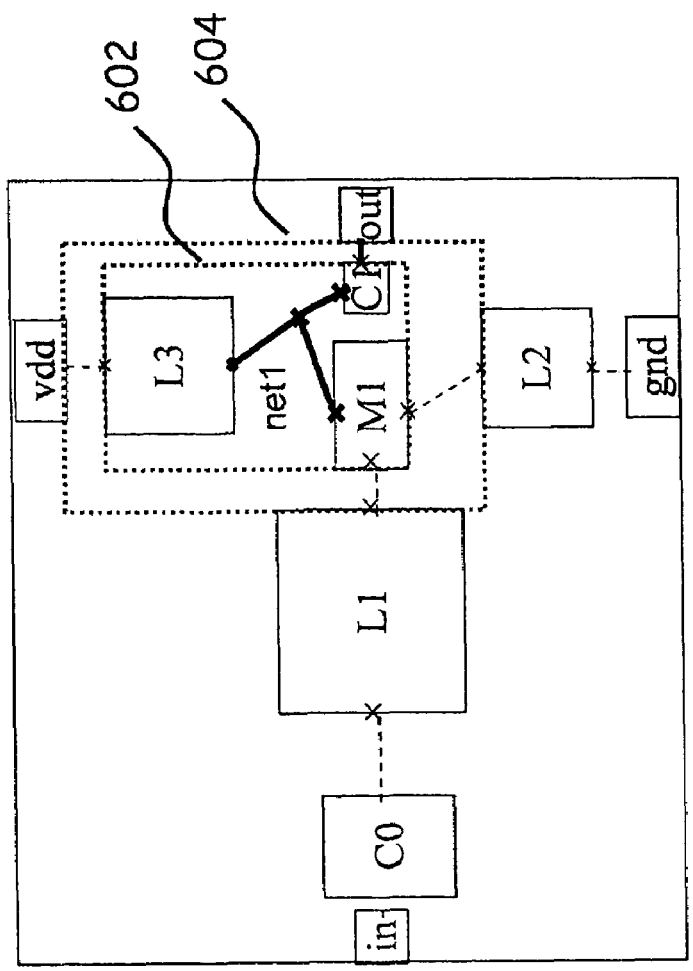
FIG. 6 illustrates a method for tuning lengths of nets according to an embodiment of the present invention.

FIG. 6 illustrates a method for tuning lengths of nets according to an embodiment of the present invention. Net scaling allows the lengths of nets to be tuned, which is achieved by moving the devices attached to the net. In the example shown in FIG. 6, the length of the net "net1" can be increased by moving the devices L3, M1, and C1 farther away from each other. The maximum length allowed for the net is determined by how far the devices attached to the net can be moved away from each other without overlapping other devices. For example, for net1, the initial bounding box of the devices connected to the net is shown by 602. The devices can be moved farther away to the bounding box perimeter shown as 604, which is restricted by the devices L1, L2, out, and Vdd. Similarly, "net1" may be shortened by moving the devices L3, M1, and C1 closer to each other. This determines the minimum and maximum amounts by which the net can be scaled. The scaling factor is defined as a ratio of the new length of the net to the original length of the net. For example, a net scaling of 1.1 implies that the net can be increased in length by 1.1 times the original length of the net.

Figure 7:
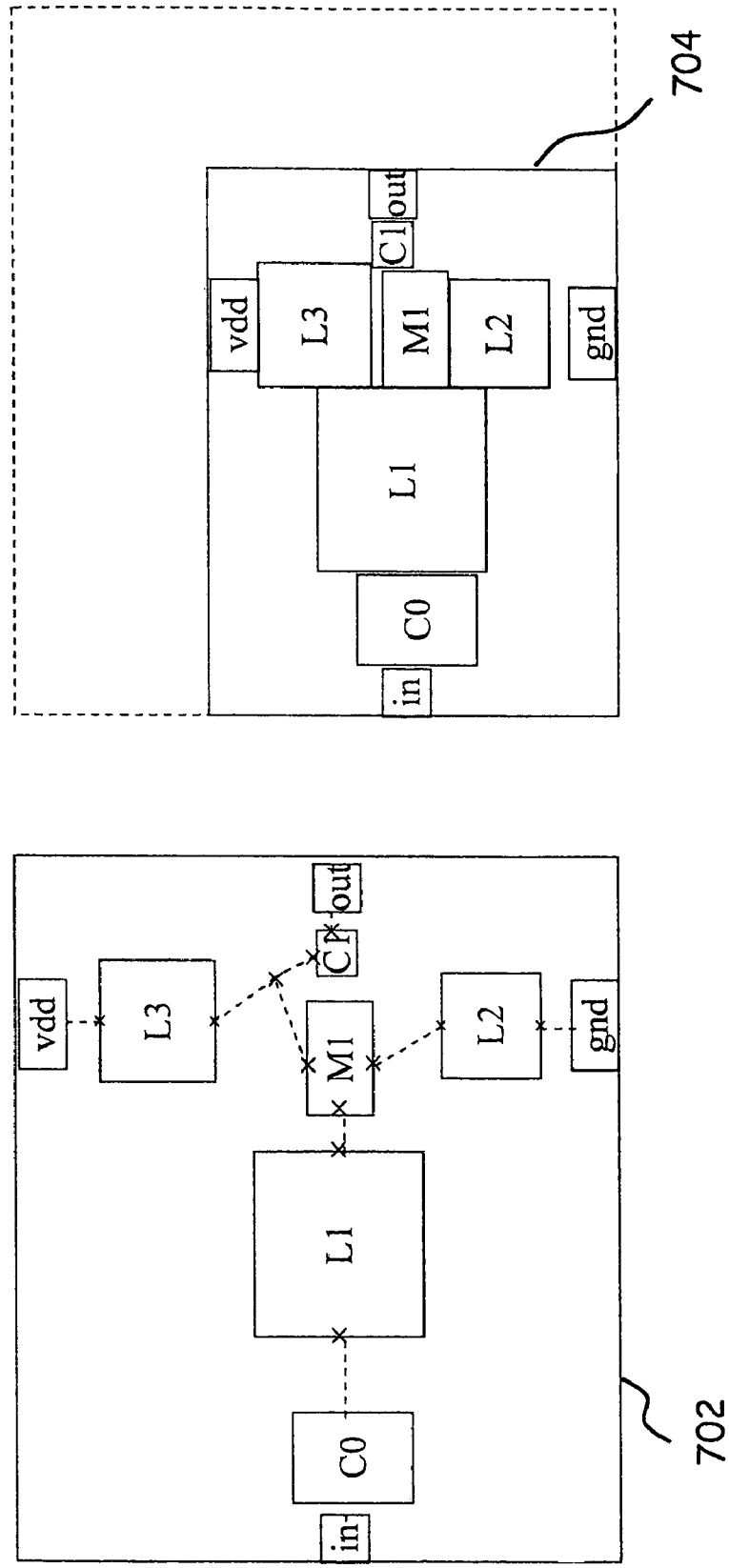
FIG. 7 illustrates a method for identifying layout area scaling range according to am embodiment of the present invention.

FIG. 7 illustrates a method for identifying layout area scaling range according to an embodiment of the present invention. Layout area scaling allows the overall area of the layout to be tuned, which is achieved by moving all the devices in the layout away from each other or closer to each other. As shown in FIG. 7, the original layout area 702 may be decreased to the new layout area 704, by moving all devices in the layout as close to each other as possible. In this example, the devices cannot be moved closer to each other without the devices overlapping each other in the new layout area 704. This determines the allowable layout area values for the given configuration of devices. The layout area scaling is defined as a ratio of the new layout area to the original layout area. For most applications, the designer simply requires the layout to be shrunk. In such cases, the maximum layout area scaling is 1.0, which indicates the layout area is the same (a multiple factor of 1) as the original layout area.

FIG. 8 illustrates an example set of design variables and their corresponding sample values according to an embodiment of the present invention. Device location tuning variables are introduced corresponding to device locations for each of the devices that are being tuned. In this example, M1_length, Bias_current, M2_length and M3_length represent the original device variables already included in the sizing tool. They represent optimization variables the sizing tool can modify during the optimization process. For example, M1_length corresponds to the length of a transistor M1. The range [20u:2u:30u] means that the sizing tool may vary the length of transistor M1 from 20 microns (um) to 30 um in increments of 2 um. The sample values for these variables are received as user inputs to the sizing tool.

In addition, the tuning variables RFTUNE_DEVICE_X_C0 and RFTUNE_DEVICE_Y_C0 correspond to device location tuning variables for device C0 in the x (horizontal) and y (vertical) directions respectively. The range [0u:10u:90u] for RFTUNE_DEVICE_X_C0 means that device C0 ( may be moved in the x direction by a distance from 0 to a maximum distance of 90 um. The allowable distances are numbers between 0 um and 90 um, in increments of 10 um, i.e., 20 um, 30 um, 40 um, and so on.

Device orientation tuning variables are used to correspond to device orientations for each of the devices that are being tuned. For example, in FIG. 8, the tuning variable RFTUNE_ORIENTATION_C0 corresponds to device C0's orientation. The range [0:1:7] represents that the device is allowed any of the 0 to 7 orientations shown in FIG. 5.

Net tuning variables are used for each of the critical net branches that are being tuned. In the example shown in FIG. 8, the tuning variables RFTUNE_NET_E_M1_D and RFTUNE_NET_E_i2_in correspond to two branches of the critical net E. One branch is connected to terminal D of device M1, and the other branch is connected to terminal "in" of device i2. The tuning range [0.7:0.1:1] means the net length ratio is allowed to vary from 0.7 to 1 in increments of 0.1. In this example, if RFTUNE_NET_E_M1_D is set to 0.7, it means that the branch connected to terminal D of device M1 needs to be shrunk to 70% of its original length.

Similarly, the layout area tuning variable RFTUNE_LAYOUT is used to tune the overall cell area. The range [70:10:100] means that the area may be set to 70% to 100% of original total layout area with increments of 10%. During the optimization process, in addition to the device sizes, the sizing tool also sends tuning variable values for device locations, device orientations, net scaling, and layout area scaling to the layout tool. The following paragraphs describe the use of the tuning information by the layout tool. Specifically, the layout tool automatically generates a tuned layout using the above information received from the sizing tool.

Figure 9:
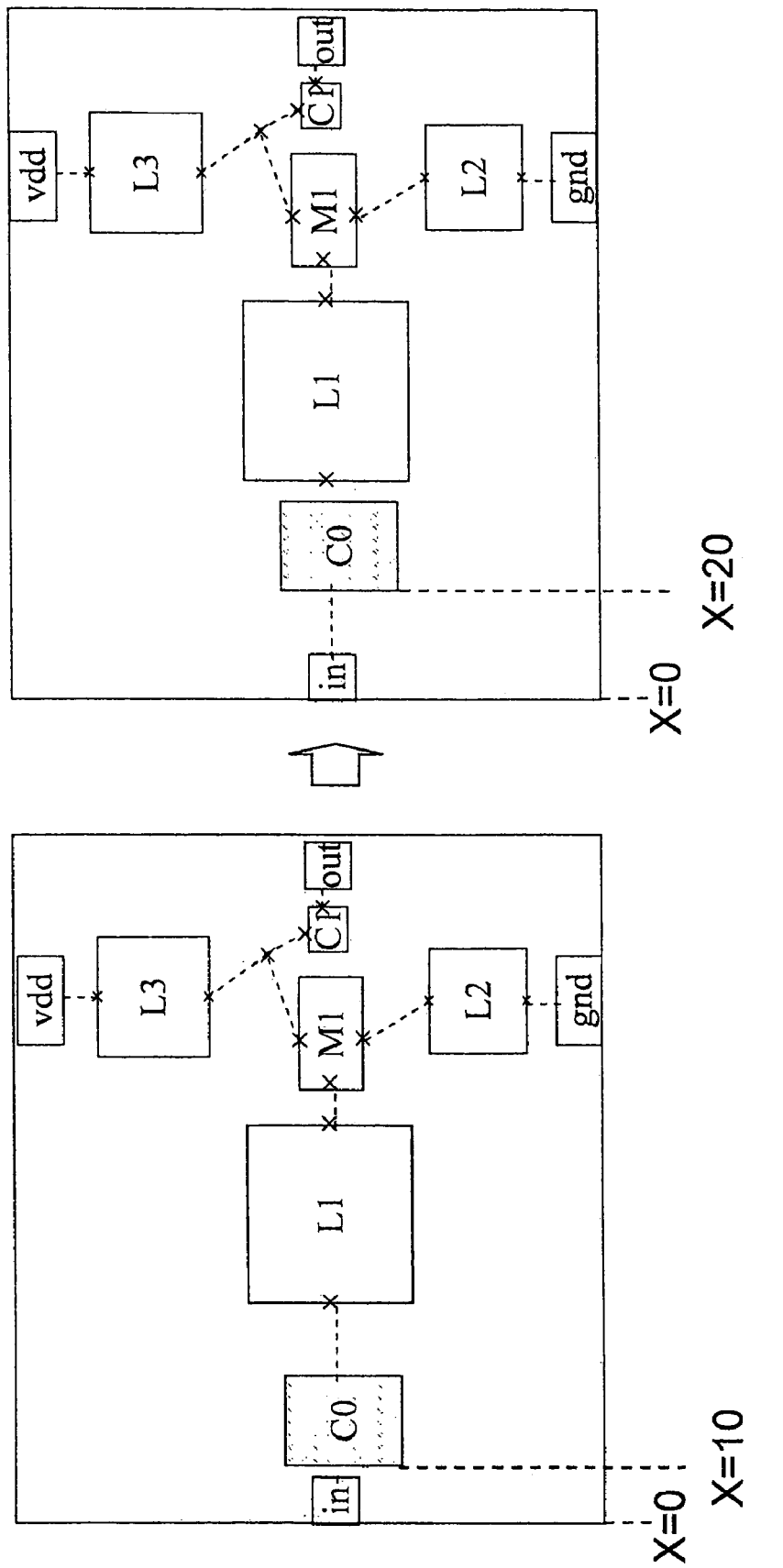
FIG. 9 illustrates a method for tuning device location according to an embodiment of the present invention.

FIG. 9 illustrates a method for tuning device location according to an embodiment of the present invention. Device location tuning is achieved by moving the devices according to the value of the device location tuning variable. The device is moved along the designated direction by the distance indicated by the variable value. In this example, if the value of the device location tuning variable, RFTUNE_DEVICE_X_C0, is specified by the sizing tool as 10, then the device is moved from its original location of x=10 um to its final location x=20 um (10 um+10 um) as shown in FIG. 9.

Figure 10:
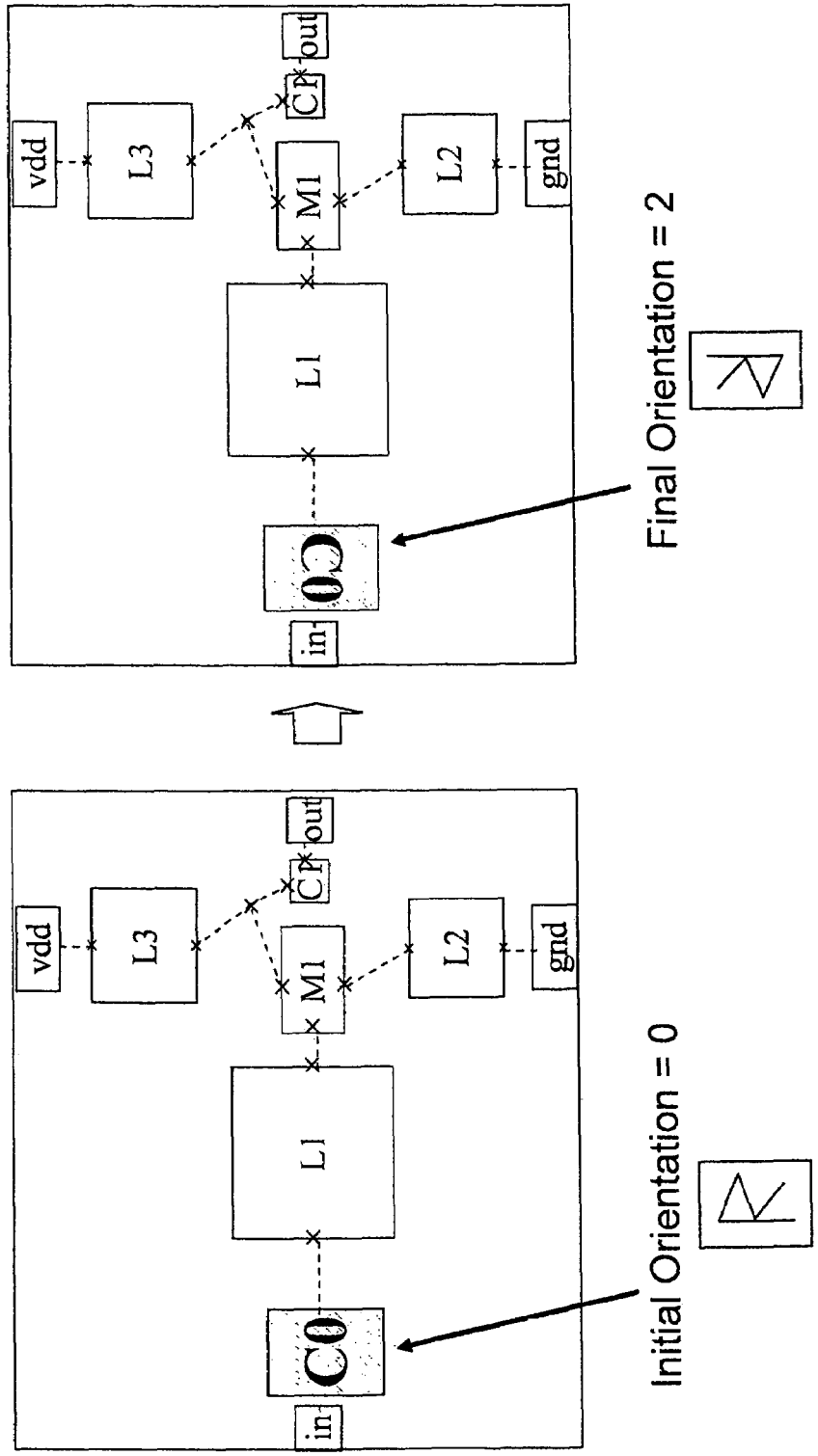
FIG. 10 illustrates a method for tuning device orientation according to an embodiment of the present invention.

FIG. 10 illustrates a method for tuning device orientation according to an embodiment of the present invention. Device orientation tuning is achieved by rotating and/or flipping the device according to the value of the device orientation tuning variable. For instance, if the value of the device orientation tuning variable RFTUNE_ORIENTATION_C0 is specified by the sizing tool as 2, then layout tool flips the device C0 in both x and y directions to create its new orientation in the layout as shown in FIG. 10.

FIG. 11 illustrates a method for tuning lengths of nets according to an embodiment of the present invention. Net length tuning is achieved by shrinking or expanding specific net branches according to the value of lengths of net tuning variables. As shown in FIG. 11, the lengths of net tuning variables RFTUNE_NET_net1_L3_MINUS, RFTUNE_NET_net1_C1_D, and RFTUNE_NET_net1_M1_C correspond to the lengths of net portions 1102, 1104, and 1106 respectively, which are part of net1 in FIG. 11. In this example, if the values of each of these tuning variables are set by the sizing tool to be 1.4, then each of the three branches 1102, 1104, and 1106 of net1 will be expanded to 140% of its original length. This is accomplished by distancing the devices C1, L3 and M1 farther away from each other as illustrated in FIG. 11.

Figure 12:
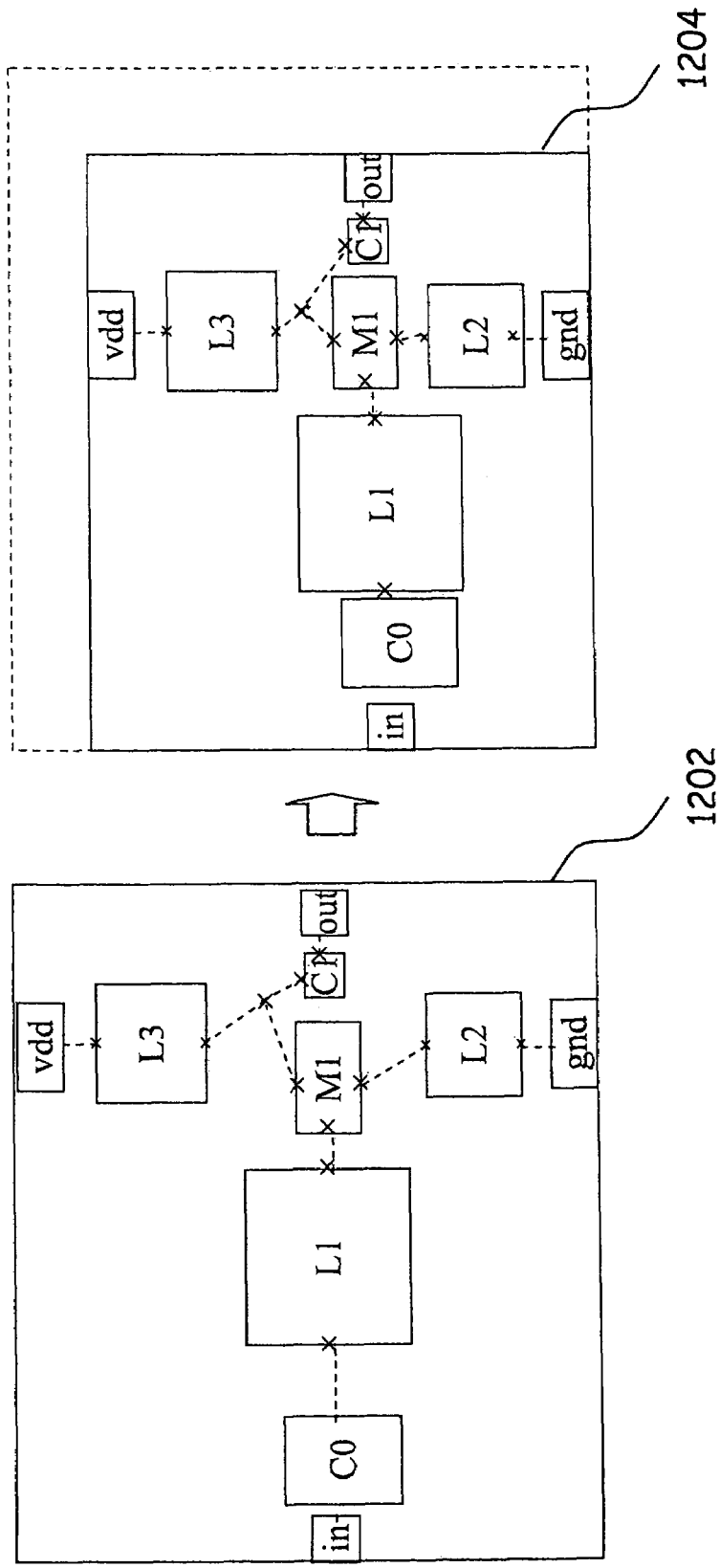
FIG. 12 illustrates a method for tuning layout area according to an embodiment of the present invention.

FIG. 12 illustrates a method for tuning layout area according to an embodiment of the present invention. Layout area tuning is achieved by shrinking or expanding the layout area of devices of interest according to the value of the layout area tuning variable. In this example, if the value of layout tuning variable RFTUNE_LAYOUT is specified by the sizing tool as 80, then the layout may be shrunk to 80% (represented by area 1204) of its original area (represented by area 1202) as shown in FIG. 12. This is accomplished by moving the devices closer to each other in the layout, while maintaining their relative positions with respect to each other.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more microprocessors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A method for tuning a circuit, comprising:
   receiving a description of the circuit;
   selecting a design point of the circuit for evaluation using a sizing tool, wherein the design point comprises a design of the circuit that meets a set of predefined design specifications, and wherein the circuit comprises a group of circuit devices;
   receiving a set of tuning information for the group of circuit devices, wherein the set of tuning information includes tuning ranges and corresponding increments applicable within the tuning ranges;
   tuning the group of circuit devices using the set of tuning information to create a group of tuned circuit devices;
   creating an updated layout of the group of tuned circuit devices using a layout tool;
   creating estimated parasitic information of the group of tuned circuit devices using the updated layout; and
   verifying by a computer the design point meets design goals of the circuit using the estimated parasitic information of the updated layout.

2. The method of claim 1, wherein the set of tuning information comprises at least one item selected from the group consisting of:
   device sizes, device locations, device orientations, scales of lengths of nets, and scales of layout area.

3. The method of claim 1, wherein tuning the group of circuit devices comprises:
   identifying ranges of device variables, wherein the device variables include length, width, and bias current; and
   adjusting the group of circuit devices according to the corresponding ranges of device variables.

4. The method of claim 1, wherein tuning the group of circuit devices comprises:
   identifying ranges of device locations; and
   adjusting the group of circuit devices according to the corresponding ranges of device locations.

5. The method of claim 1, wherein tuning the group of circuit devices comprises:
   identifying ranges of device orientations; and
   adjusting the group of circuit devices according to the corresponding ranges of device orientations.

6. The method of claim 1, wherein tuning the group of circuit devices comprises:
   identifying scales of lengths of nets between devices; and
   adjusting the group of circuit devices according to the corresponding scales of lengths of nets between devices.

7. The method of claim 1, wherein tuning the group of circuit devices comprises:
   identifying scales of layout area; and
   adjusting the group of circuit devices according to the corresponding scales of layout area.

8. The method of claim 1, wherein verifying the design point comprises:
   simulating the design point using the updated layout and its corresponding estimated parasitic information; and
   optimizing design costs of the design point using the updated layout and its corresponding estimated parasitic information.

9. The method of claim 1 further comprises:
   repeating tuning the circuit using a new design point until the design goals of the circuit are met.

10. A computer program product for tuning a circuit, comprising a medium storing computer programs code for execution by one or more computer systems, the computer program product comprising:
    code for receiving a description of the circuit;
    code for selecting a design point of the circuit for evaluation using a sizing tool, wherein the design point comprises a design of the circuit that meets a set of predefined design specifications, and wherein the circuit comprises a group of circuit devices;
    code for receiving a set of tuning information for the group of circuit devices, wherein the set of tuning information includes tuning ranges and corresponding increments applicable within the tuning ranges;
    code for tuning the group of circuit devices using the set of tuning information to create a group of tuned circuit devices;
    code for creating an updated layout of the group of tuned circuit devices using a layout tool;
    code for creating estimated parasitic information of the group of tuned circuit devices using the updated layout; and
    code for verifying the design point meets design goals of the circuit using the estimated parasitic information of the updated layout.

11. The computer program product of claim 10, wherein the set of tuning information comprises at least one item selected from the group consisting of:
    device sizes, device locations, device orientations, scales of lengths of nets, and scales of layout area.

12. The computer program product of claim 10, wherein the code for tuning the group of circuit devices comprises:
    code for identifying ranges of device variables, wherein the device variables include length, width, and bias current; and
    code for adjusting the group of circuit devises according to the corresponding ranges of device variables.

13. The computer program product of claim 10, wherein the code for tuning the group of circuit devices comprises:
    code for identifying ranges of device locations; and
    code for adjusting the group of circuit devices according to the corresponding ranges of device locations.

14. The computer program product of claim 10, wherein the code for tuning the group of circuit devices comprises:
    code for identifying ranges of device orientations; and
    code for adjusting the group of circuit devices according to the corresponding ranges of device orientations.

15. The computer program product of claim 10, wherein the code for tuning the group of circuit devices comprises:
    code for identifying scales of lengths of nets between devices; and
    code for adjusting the group of circuit devices according to the corresponding scales of lengths of nets between devices.

16. The computer program product of claim 10, wherein the code for tuning the group of circuit devices comprises:
   code for identifying scales of layout area; and
   code for adjusting the group of circuit devices according to the corresponding scales of layout area.

17. The computer program product of claim 10, wherein the code for verifying the design point comprises:
   code for simulating the design point using the updated layout and its corresponding estimated parasitic information; and
   code for optimizing design costs of the design point using the updated layout and its corresponding estimated parasitic information.

18. The computer program product of claim 10 further comprises:
   code for repeating tuning the circuit using a new design point until the design goals of the circuit are met.

19. A system for tuning a circuit, comprising:
   at least one processing unit for executing computer programs;
   a graphical-user-interface for viewing representations of the circuit on a display;
   a memory for storing information of the circuit;
   logic for receiving a description of the circuit;
   logic for selecting a design point of the circuit for evaluation using a sizing tool, wherein the design point comprises a design of the circuit that meets a set of predefined design specifications, and wherein the circuit comprises a group of circuit devices;
   logic for receiving a set of tuning information for the group of circuit devices, wherein the set of tuning information includes tuning ranges and corresponding increments applicable within the tuning ranges;
   logic for tuning the group of circuit devices using the set of tuning information to create a group of tuned circuit devices;
   logic for creating an updated layout of the group of tuned circuit devices using a layout tool;
   logic for creating estimated parasitic information of the group of tuned circuit devices using the updated layout; and
   logic for verifying the design point meets design goals of the circuit using the estimated parasitic information of the updated layout.

20. The system of claim 19, wherein the set of tuning information comprises at least one item selected from the group consisting of:
   device sizes, device locations, device orientations, scales of lengths of nets, and scales of layout area.

21. The system of claim 19, wherein the logic for tuning the group of circuit devices comprises:
   logic for identifying ranges of device variables, wherein the device variables include length, width, and bias current; and
   logic for adjusting the group of circuit devices according to the corresponding ranges of device variables.

22. The system of claim 19, wherein the logic for tuning the group of circuit devices comprises:
   logic for identifying ranges of device locations; and
   logic for adjusting the group of circuit devices according to the corresponding ranges of device locations.

23. The system of claim 19, wherein the logic for tuning the group of circuit devices comprises:
   logic for identifying ranges of device orientations; and
   logic for adjusting the group of circuit devices according to the corresponding ranges of device orientations.

24. The system of claim 19, wherein the logic for tuning the group of circuit devices comprises:
   logic for identifying scales of lengths of nets between devices; and
   logic for adjusting the group of circuit devices according to the corresponding scales of lengths of nets between devices.

25. The system of claim 19, wherein the logic for tuning the group of circuit devices comprises:
   logic for identifying scales of layout area; and
   logic for adjusting the group of circuit devices according to the corresponding scales of layout area.

26. The system of claim 19, wherein the logic for verifying the design point comprises:
   logic for simulating the design point using the updated layout and its corresponding estimated parasitic information; and
   logic for optimizing design costs of the design point using the updated layout and its corresponding estimated parasitic information.

27. The system of claim 19 further comprises:
   logic for repeating tuning the circuit using a new design point until the design goals of the circuit are met.

* * * * *